July 7, 1970 J. E. JENNINGS ET AL 3,519,852
LOW POWER ANALOG SWITCH
Filed Sept. 26, 1967

WITNESSES
Robert G. Baird
James F. Young

INVENTORS
James E. Jennings
and Edmund A. Karcher.
BY Dean Schron
ATTORNEY

United States Patent Office 3,519,852
Patented July 7, 1970

3,519,852

LOW POWER ANALOG SWITCH

James E. Jennings, Bowie, Md., and Edmund A. Karcher, Palm Beach Gardens, Fla., assignors to Westinghouse Electric Corporation, Pittsburgh, Pa., a corporation of Pennsylvania Filed Sept. 26, 1967, Ser. No. 671,184
Int. Cl. H03k *17/00*
U.S. Cl. 307—253 8 Claims

ABSTRACT OF THE DISCLOSURE

A junction field effect transistor (FET) has its source electrode connected to a source of analog signals and its drain electrode connected to provide an output signal. The gate electrode is connected to a current sink which is turned on when a first input signal is applied to an input terminal of the switch.

The analog signal is also connected to the base of a transistor, the emitter of which is connected to a circuit point. Connected between the circuit point and a source of current is a diode with its cathode connected to the circuit point and its anode being additionally connected to the gate electrode of the FET. The circuit point is connected to a current sink which is turned on in response to a second input signal applied to the switch. Current is supplied to the second current sink by means of the transistor while the source of current raises the potential at the gate electrode until such point that the diode conducts whereupon the diode and the transistor supply the current to the second current sink. For any change in analog voltage a corresponding change occurs at the cathode of the diode causing the anode thereof to increase or decrease in potential accordingly, thereby maintaining the voltage at the gate electrode of the FET substantially equal to the voltage of the source electrode thereof to prevent forward biasing of the gate-source junction and to reduce current feedthrough from the gate to the source circuit. When the voltage at the gate electrode is raised, the FET turns on to pass the analog signal.

BACKGROUND OF THE INVENTION

The invention described herein was made in the performance of work under a NASA contract and is subject to the provisions of section 305 of the National Aeronautics and Space Act of 1958, Public Law 85–568 (72 Stat. 435; 42 U.S.C. 2457).

Field of the invention

The invention in general relates to a switching circuit for periodically sampling an analog signal, and particularly to a semiconductor analog switch utilizing a junction field effect transistor and wherein power dissipation is minimized.

Description of the prior art

In analog switches utilizing junction FET's it is important that the gate-source junction does not become forward biased since the forward biasing of this junction will cause an unwanted current in the gate-source circuit resulting in errors in the analog voltage at the switch output.

In order to minimize power consumption and to insure fast switching operation, the voltage extremes at the gate electrode of the FET is reduced by choosing a high valued capacitor in the gate circuit. Very often it is desired to fabricate the analog switch as an integrated circuit, however, the value of capacitors that can be fabricated in an integrated circuit chip is severely limited since to fabricate high valued capacitors the integrated circuit chip would have to be increased to an unwarranted size.

It is therefore a general object of the present invention to provide an analog switch in which power dissipation is minimized and in which the gate-source junction of the FET utilized is prevented from being forward biased.

Another object is to provide an analog switch which may be fabricated by integrated circuit techniques and wherein the need for large valued capacitors is eliminated.

SUMMARY OF THE INVENTION

A semiconductor switch means includes an input electrode, a first electrode connected to an analog signal source, and a second electrode. In response to a proper control signal at the input electrode, the switch means is operable to close, thereby gating the analog signal to an output utilization means.

A voltage comparison means includes a first and second section commonly connected together at a circuit point with the first section being connected to receive the analog voltage whereby there is established at the circuit point a voltage which is a function of the analog signal. The second section is connected to the input electrode of the switching means and is operable to conduct in response to certain voltage conditions at the circuit point and the input electrode.

To deactivate the switching means there is provided a current conducting switching means connected to the input electrode and operable in response to a first input signal. Upon the application of a second input signal a second current conducting switch means connected to the common circuit point turns on to allow operation of the voltage comparison means whereby the voltage at the input electrode is maintained at a substantially constant prescribed value with respect to the analog signal.

DESCRIPTION OF THE PREFERRED EMBODIMENT

Figure 1:
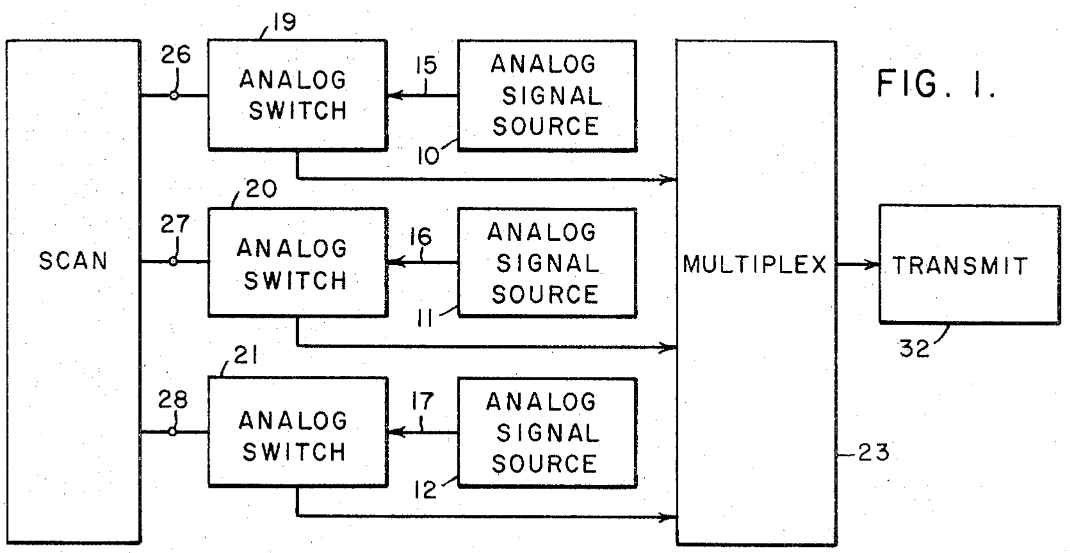
FIG. 1 illustrates in block diagram form, a telemetry system in which the present invention finds utilization.

FIG. 1 illustrates one system in which the analog switch may be utilized. The system is a telemetry system which transmits various data from a remote position to a central correlating station. In such systems physical information, such as temperature, pressure, stress, etc. are translated into analog voltages which are periodically sampled, multiplexed, and transmitted. In FIG. 1 there is illustrated three analog signal sources 10, 11 and 12 each operable to provide, on output leads 15, 16 and 17 respectively, an analog signal representative of a certain condition. Each of the analog signals is gated through respective analog switches 19, 20 and 21 to the multiplex circuit 23 when the associated analog switch is closed. The closing of analog switches 19, 20 and 21 takes place in a sequential manner by the provision of an interrogate signal sequentially provided at input terminals 26, 27 and 28 by the scanning means 30.

During the scanning operation the analog signals passed by the analog switches are multiplexed and transmitted to a distance point by means of the transmitter 32. In order to transmit a true picture of the analog signal, it is important that the analog switch circuit does not interact with the analog signal source. In the present invention the analog switch includes a semiconductor switching means in the form of an FET and to this end reference is now made to FIG. 2.

Figure 2:
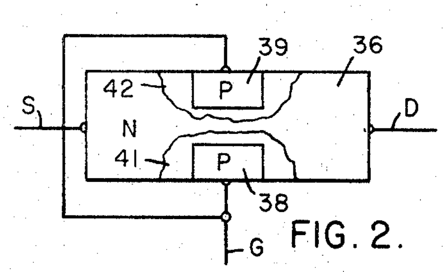
FIG. 2 illustrates a field effect transistor.

A typical junction FET as illustrated in FIG. 2 includes a bar 36 of one type of semiconductivity illustrated as an N type, and two opposite conductivity, P type regions 38 and 39. A connection to one end of the bar 36 constitutes the source electrode S, and a connection at the other end of the bar 36 forms the drain electrode D. Electrical connections to gate regions 38 and 39 forms the gate electrode G. With the addition of the P regions 38 and 39 barrier regions 41 and 42 are formed around the resulting PN junctions. With proper reverse bias applied between the gate and source electrodes, the barriers 41 and 42 widen to restrict flow of electrons between the source and drain electrodes until such point where the FET is cut off simulating an open switch. An FET is utilized in the practice of the present invention in a mode where it is either fully conducting or fully cut-off.

Figure 2A:
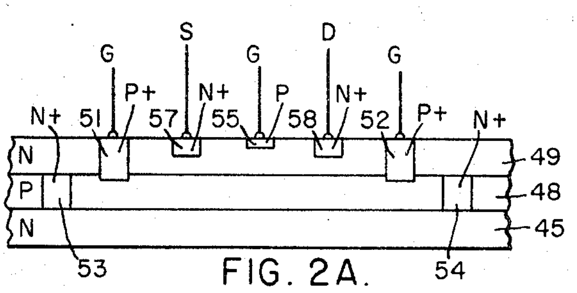
FIG. 2A illustrates the field effect transistor of FIG. 2 as fabricated in typical integrated circuit form.

In FIG. 2A, there is illustrated a typical FET fabricated by integrated circuit techniques. The FET is formed on an N-type wafer substrate 45. Successive regions of P-type epitaxial material 48 and N-type epitaxial material 49 are successively formed on the substrate 45. The P region 48 forms one gate such as region 38 in FIG. 2, and highly doped P+ regions 51 and 52 are diffused through the N region 38 into the P region 49 to form gate contacts. Two N+ regions 53 and 54 form isolation walls whereby a plurality of FET may be fabricated on substrate 45. A gate region similar to gate region 39 of FIG. 2 is formed by a diffusion process of a P region 55, and highly doped N+ regions 57 and 58 are formed in the N-type region 49 forming the source and drain electrodes respectively with the N-type material 49 between the regions 57 and 58 being analogous to the bar of N-type material 36 of FIG. 2.

Figure 3:
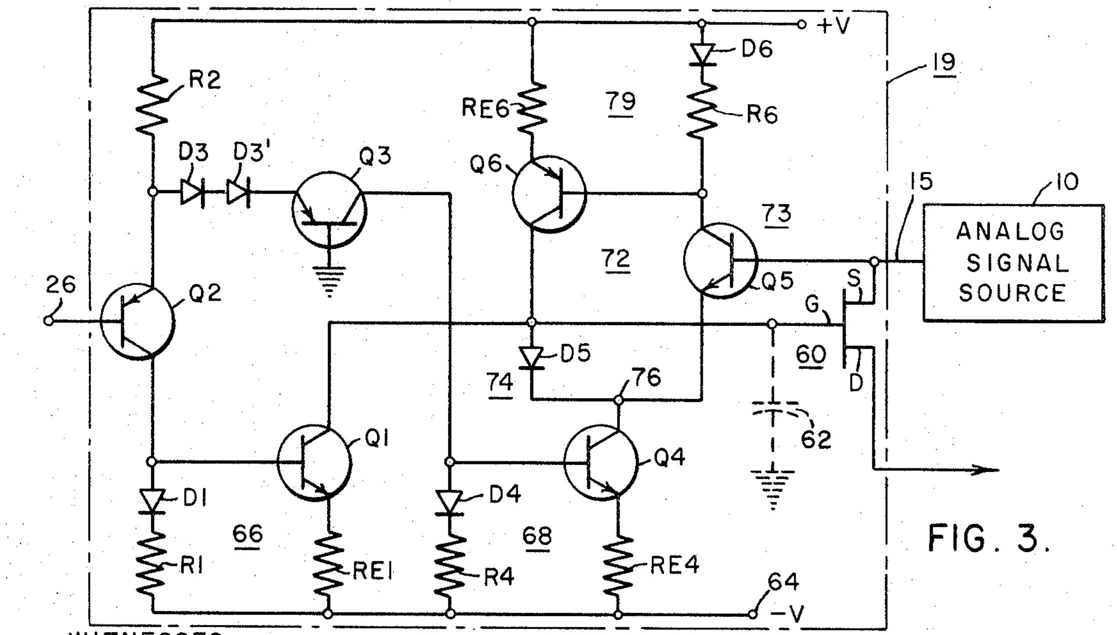
FIG. 3 illustrates, in circuit component form, a preferred embodiment of the present invention.

FIG. 3 illustrates in more detail a typical analog switch, such as analog switch 19 of FIG. 1. Switch 19 includes FET 60 including an input electrode, the gate G for receiving control signals, a source electrode S connected via lead 15 to receive the analog signal from analog signal source 10, and an output electrode, the drain D for passing the analog signal voltage when the proper control signals are applied to the gate G.

Associated with the gate G and illustrated as being connected between the gate G and ground, is an equivalent capacitor 62 representing the capacitance to ground at the gate electrode, caused by the gate capacitance, stray capacitance, and if fabricated as an integrated circuit, the substrate isolation capacitance of the integrated circuit structure. The gate to source voltage determines whether the FET 60 conducts or is cut-off.

Connected between the gate G and the terminal 64, to which a source of reference potential —V is applied, is a first current conducting switch means 66 which is operable to conduct in response to an input signal of a first type applied at the input terminal 26. The switch means 66 includes a transistor Q1 having an emitter resistor RE1. Connected in parallel with the base-emitter diode of transistor Q1 and resistor RE1 is the serial connection of diode D1 and resistor R1. The diode D1 is chosen or fabricated to have the same voltage drop, and respond in the same manner to temperature variations, as the base-emitter diode of transistor Q1 and since these voltage drops are equal, the voltage across resistor R1 is equal to the voltage across resistor RE1. The arrangement therefore establishes a known voltage across resistor RE1 to thereby set a level of maximum current which the switch means 66 can conduct, more particularly the current in the collector-emitter circuit of transistor Q1. The switch means 66 may be viewed as a current source or current sink depending upon which current convention is utilized. In the discussions herein current will be assumed to flow from a relatively positive voltage to a relatively negative voltage.

With the application of a zero or negative input signal applied at the input terminal 26, transistor Q2 will turn on supplying base current to transistor Q1 which when conducts is supplied with current from the previously built up charge on capacitor 62 and will conduct for a period of time until such charge is depleted whereupon the voltage across capacitor 62 will be substantially equal to the reference potential —V at terminal 64 to constitute a cut-off signal to the FET.

Resistor R2 in the emitter circuit of transistor Q2 limits the current to a value whereby power dissipation is minimized.

The voltage at the emitter of transistor Q2 is of such value that transistors Q3, Q4, Q5 and Q6 are nonconducting. Upon the application of a positive or second type input signal at input terminal 26, transistor Q2 cuts off while the voltage at the emitter thereof rises to a point which is two diode drops D3 and D3′ or higher above ground potential whereupon transistor Q3 turns on to supply base current to transistor Q4 of a second current conducting switch means 68. The switch means 68 includes an emitter resistor RE4, with the base-emitter diode of transistor Q4 and resistor RE4 being connected in parallel with diode D4 and resistor R4 in a manner similar to the switch means 66 such that the current in the collector-emitter circuit of transistor Q4 is fixed by the proper choice of emitter resistor RE4.

The turning on of switch means 68 allows the remaining transistors Q5 and Q6 to conduct in the following manner. In the operation of the system it is important that the analog signal at lead 15 be passed from the source electrode to the drain or output electrode without any deterioration or distortion and accordingly it is important that the gate to source junction of the FET 60 does not become forward biased since if forward biased, the gate-source junction would act as a diode and permit gate current to enter the source drain circuit affect the analog signal being gated. When conducting, the difference between the FET source and gate voltage is maintained substantially constant. Accordingly in the present invention more specifically and by way of one example the gate potential is maintained substantially equal to the source potential so that the junction never gets forward biased. This is accomplished by the inclusion of a voltage comparison means 72 including first and second sections 73 and 74 commonly connected together at a circuit point 76. The first section is comprised of transistor means in a form of an NPN transistor Q5 having its input or base electrode connected to receive the analog signal at the source electrode S of FET 60, and its emitter electrode connected to the circuit point 76. The second section is comprised of diode means in the form of diode D5 having its cathode electrode connected to the common circuit point 76 and its anode electrode connected to the gate electrode G of FET 60.

The anode of diode D5 and the collector of transistor Q5 are additionally connected to a current source illustrated as current conducting switch means 79 having transistor Q6 and emitter resistor RE6 in parallel with diode D6 and resistor R6 in a manner similar to the other current conducting switch means 66 and 68.

Just prior to the application of a positive signal at input terminal 26, the voltage across capacitor 62, and consequently the voltage at the gate G of FET 60, is the reference potential applied at terminal 64, that is —V. When the positive input signal is applied, signifying that the analog signal is to be sampled, conduction of transistor Q3 causes transistor Q4 to turn on which is thereby supplied with current from the transistor Q5 having the analog signal applied at its base. The turning on of transistor Q5 causes transistor Q6 to turn on to supply charging current to capacitor 62.

The voltage at the circuit point 76 is equal to the voltage at the base of transistor Q5 minus the base-emitter voltage drop thereof. Since the voltage at the base of transistor Q5 is equal to the analog signal at the source electrode S, it follows therefrom that the potential at the cathode of diode D5, connected to circuit point 76, is a function of the analog signal and is equal to the analog voltage minus the base-mittter diode drop of transistor Q5. Since, when transistor Q4 turns on, the voltage across the capacitor 62 is at a relatively negative value, the current supplied by transistor Q6 is utilized to charge the capacitor 62 to increase the voltage thereacross. During such charge build-up process, diode D5 is in a non-conducting condition since its anode, connected to the gate G is at a lower potential than its cathode connected to circuit point 76. The voltage across capacitor 62 increases such that diode D5 becomes conducting and to when fully conducting the voltage at the anode of diode D5 is one diode drop above the voltage at circuit point 76. Since the gate G is connected to the anode of diode D5 the gate G is also at one diode drop above the voltage at circuit point 76. The voltage at one diode drop above the voltage at circuit point 76 is, in actuality, the voltage at the base of transistor Q5, that is, the analog voltage, and it is seen that if the voltage drop across diode D5 is equal to the base-emitter diode drop of transistor Q5 then the voltage at the gate G is equal to the voltage at the source electrode S. Stated mathematically $$V_{76}=V_S-V_{BE} \quad (1)$$

$$V_{76}=V_G-V_D \quad (2)$$

where $V_{76}$=voltage at circuit point 76
$V_S$=voltage at source electrode S (=the analog voltage)
$V_{BE}$=base-emitter voltage drop of transistor Q5
$V_G$=voltage at gate electrode 6
$V_D$=voltage drop across conducting diode D5 combining Equations 1 and 2

$$V_S-V_{BE}=V_G-V_D \quad (3)$$

since $V_{BE}=V_D$, Equation (3) therefore reduces to $V_S=V_G$.

In order to insure that $V_{BE}=V_D$ it is preferable that the switch be fabricated as an integrated circuit and that the diode D5 be fabricated as a transistor matching transistor Q5 and having two of its electrodes commonly connected together, for example its base and collector electrodes. The collector current of transistor Q4 is maintained at a fixed value and prior to the conduction of diode D5, is entirely supplied by transistor Q5. After the conduction of diode D5 transistor Q5 supplies less current thereby tending to reduce the current supplied by transistor Q6. As long as the positive signal is maintained at input terminal 26 an equilibrium condition within the voltage compensating means 72 exists whereby the current needed for transistor Q4 is supplied both by transistor Q5 and by transistor Q6, through diode D5. Increases in analog signal tends to cause diode D5 to conduct less and transistor Q5 to conduct more current for supplying the collector current of transistor Q4. Increased conduction of transistor Q5 causes increased conduction of transistor Q6 which then supplies current to increase the voltage across capacitor 62 accordingly. Decreases in analog signal tend to cause diode D5 to conduct more and transistor Q5 to conduct less current than being supplied to diode D5 additionally by capacitor 62 thereby decreasing the voltage thereacross accordingly.

When the first type signal is thereafter applied at input terminal 26, transistors Q3, Q4, Q5 and Q6 turn off while Q1 conducts, collector current being supplied by the stored charge on capacitor 62.

Accordingly there has been provided an analog switch utilizing an FET and wherein, when the analog signal is sampled, the voltage at the gate electrode is maintained substantially equal to the voltage at the source electrode by means of a self-regulating voltage comparison means so that the sampling of the analog signal is undistorted. Supply current (through R2) for turning on the various transistors is maintained at a value to minimize power dissipation and collector-emitter currents of the various transistors are maintained at a chosen preset value to also mnimize power dissipation.

Although the present invention has been described with a certain degree of particularity, it should be understood that the present disclosure has been made by way of example and that modifications and variations of the present invention are made possible in the light of the above teachings.

What is claimed is:

1. An analog switch comprising:
(a) semiconductor switch means including an input, first and second electrodes and operable to activate in response to a proper control signal applied to said input electrode;
(b) means for connecting a source of analog voltage to said first electrode;
(c) an input means for the application of first and second input signals;
(d) a bias terminal for the application of bias potential;
(e) first current conducting switch means connected between said input electrode and a point of reference potential and operable to conduct in response to the provision of said first input signal;
(f) voltage comparison means including first and second sections commonly connected together at a circuit point;
(g) means connecting said first electrode to said first section for establishing a voltage at said circuit point, dependent upon said analog voltage;
(h) means connecting said input electrode to said second section for governing conduction of said second section in accordance with the difference in voltage between said input electrode and said circuit point;
(i) means for connecting said first and second sections to said bias terminal; and
(j) second current conducting switch means connected between said circuit point and a point of reference potential and operable to conduct in response to said second input signal for allowing circuit conduction of said voltage comparison means.

2. An analog switch comprising:
(a) semiconductor switch means including an input, first and second electrodes and operable to conduct when a first control signal is applied to said input electrode, and to cut off when a cut off signal is applied to said input electrode;
(b) input means for receiving first and second input signals;
(c) means for connecting said first electrode to a source of analog signals;
(d) first circuit means responsive to a first input signal for applying said cut off signal to said input electrode;
(e) second circuit means for supplying said first control signal and being connected to receive the voltage at said first electrode and the voltage at said input electrode for maintaining the difference between said voltages at a substantially constant value, in response to a second input signal.

3. An analog switch according to claim 1 wherein:
(a) the second circuit means includes first and second sections commonly connected together at a circuit point;
(b) the first electrode being connected to said first section;
(c) the input electrode being connected to said second section; and which additionally includes
(d) means for connecting said sections to a current source;
(e) current conducting switch means connected between said circuit point and a point of reference potential for allowing current conduction in said sections, in response to a second input signal.

4. An analog switch according to claim 3 wherein:
(a) the first section includes transistor means having a base electrode connected to the first electrode of the switch means for the application of the analog signal, a collector electrode connected to the current source, and an emitter electrode connected to the circuit point;
(b) the second section includes diode means having one electrode connected to the circuit point and another electrode connected to both the current source and the input electrode of the switch means.

5. An analog switch according to claim 4 wherein:
(a) the base-emitter voltage drop of the transistor means is substantially equal to the voltage drop of the diode means.

6. An analog switch according to claim 4 wherein:
(a) the transistor means is a single NPN transistor; and
(b) the diode means is a single diode means whose first electrode is the cathode and whose other electrode is the anode.

7. An analog switch according to claim 3 wherein:
(a) the current conducting switch means includes a transistor means having a base electrode responsive to input signals, a collector electrode connected to the circuit point and an emitter electrode connected to a point of reference potential.

8. An analog switch according to claim 7 which includes
(a) means for limiting the collector current of the transistor means to a predetermined value.

References Cited

UNITED STATES PATENTS 3,284,692 1/1966 Gautherin ---------- 307—253

DONALD D. FORRER, Primary Examiner

D. M. CARTER, Assistant Examiner

U.S. Cl. X.R.

307—251